United States Patent
Ishikawa

(10) Patent No.: US 8,004,929 B2
(45) Date of Patent: Aug. 23, 2011

(54) SEMICONDUCTOR MEMORY DEVICE AND CONTROL METHOD THEREOF

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 448 days.

(21) Appl. No.: 12/061,717

(22) Filed: Apr. 3, 2008

(65) Prior Publication Data

US 2008/0247261 A1 Oct. 9, 2008

(30) Foreign Application Priority Data

Apr. 3, 2007 (JP) ................... 2007-096986

(51) Int. Cl.
*G11C 8/00* (2006.01)
(52) U.S. Cl. ......... 365/230.08; 365/189.02; 365/189.05; 365/189.07; 365/220; 365/233.1
(58) Field of Classification Search ............. 365/189.02, 365/189.05, 189.06, 189.07, 220, 233.1
See application file for complete search history.

(56) References Cited

U.S. PATENT DOCUMENTS 6,185,149 B1 * 2/2001 Fujioka et al. ........... 365/233.18
6,671,787 B2 * 12/2003 Kanda et al. .................. 711/167
2002/0003748 A1 * 1/2002 Fujita et al. .................... 365/233
2002/0018394 A1 * 2/2002 Takahashi ..................... 365/233

FOREIGN PATENT DOCUMENTS

JP 2000-182399 6/2000

* cited by examiner

*Primary Examiner* — Pho M Luu
*Assistant Examiner* — Tha-O Bui
(74) *Attorney, Agent, or Firm* — Young & Thompson

(57) ABSTRACT

A semiconductor memory device includes: a command latch circuit that latches a command signal; an address latch circuit that latches an address signal; a mode latch circuit that latches a mode signal; and a command decoder that selects the address latch circuit in response to the latch of a normal command by the command latch circuit, and selects the mode latch circuit in response to the latch of an adjustment command. With this arrangement, the mode signal can be dynamically received without performing a mode register set. Therefore, when a sufficiently large latch margin of the mode latch circuit is secured, there is no risk that it becomes impossible to input the mode signal.

5 Claims, 6 Drawing Sheets

|  | ADJ | ACT | READ | WRIT | PRE |
|---|---|---|---|---|---|
| CMD { C0<br>C1<br>C2 | 1<br>X<br>X | 0<br>1<br>1 | 0<br>0<br>0 | 0<br>1<br>0 | 0<br>0<br>1 |
| SELECTED INTERNAL CLOCK | SDRCLK ↑ | DDRCLK ↑↓ | DDRCLK ↑↓ | DDRCLK ↑↓ | DDRCLK ↑↓ |
| ADD/MOD | M0<br>M1<br>M2<br>M3 | A0 A4<br>A1 A5<br>A2 A6<br>A3 A7 | A0 A4<br>A1 A5<br>A2 A6<br>A3 A7 | A0 A4<br>A1 A5<br>A2 A6<br>A3 A7 | A0 A4<br>A1 A5<br>A2 A6<br>A3 A7 |

FIG.2

| MODE SIGNAL MOD | TEST RESULT |
|---|---|
| 0000 | Fail |
| 0001 | Fail |
| 0010 | Fail |
| 0011 | Pass |
| 0100 | Pass |
| 0101 | Pass ← CENTER VALUE |
| 0110 | Pass |
| 0111 | Pass |
| 1000 | Fail |
| 1001 | Fail |
| 1010 | Fail |
| 1011 | Fail |
| 1100 | Fail |
| 1101 | Fail |
| 1110 | Fail |
| 1111 | Fail |

SEMICONDUCTOR MEMORY DEVICE AND CONTROL METHOD THEREOF

TECHNICAL FIELD

The present invention relates to a semiconductor memory device and a control method thereof, and, more particularly relates to a synchronous semiconductor memory device inputting and outputting data synchronously with a clock signal, and a method of controlling the semiconductor memory device.

BACKGROUND OF THE INVENTION

At present, a main type of a semiconductor memory device as represented by a DRAM (Dynamic Random Access Memory) is a synchronous type that inputs and outputs data synchronously with a clock signal. A synchronous DRAM is most widely used as the synchronous semiconductor memory device.

The synchronous DRAM of an early date is an SDR (Single Data Rate) type that inputs and outputs data synchronously with a rising edge of a clock signal. However, in recent years, there is used a DDR (Double Data Rate) synchronous DRAM that inputs and outputs data synchronously with both edges (a rising edge and a falling edge) of a clock signal.

Even in the DDR synchronous DRAM, a latch circuit that operates synchronous with only the rising edge of the clock signal is used so as to latch a command signal and an address signal. That is, a latch circuit according to the SDR system is used with respect to a command signal and an address signal. This is because while data is required to be continuously input and output by a burst operation, a command signal and an address signal do not require a burst operation. It is more advantageous to use the SDR system having a large latch margin.

However, in recent years, along the expansion of an address space following a large density, a number of necessary address terminals increases. Therefore, to decrease the number of address terminals, a method of inputting an address signal twice by dividing this signal by the DDR system is proposed. According to this method, the number of address terminals can be substantially halved.

Japanese Patent Application Laid-open No. 2000-182399 discloses a semiconductor memory device that can change between the SDR system operation and the DDR system operation.

However, when the address signal is input by the DDR system, a latch margin decreases substantially from the conventional margin. Therefore, an input timing of the address signal needs to be fine adjusted, just as an input and output timing of data needs to be fine adjusted. However, to perform this timing adjustment, a mode signal needs to be supplied from the address terminal after entering to a mode register set (MRS) by a predetermined command being issued. Accordingly, depending on a deviation of latch timing, it becomes difficult to correctly latch the mode signal itself. In this case, adjustment cannot be performed.

SUMMARY OF THE INVENTION

It is therefore an object of the present invention to provide a semiconductor memory device capable of securely adjusting a latch margin of an address signal, and a method of controlling the semiconductor memory device.

Another object of the present invention is to provide an improved semiconductor memory device to which an address signal can be input by the DDR system, and a method of controlling the semiconductor memory device.

The above and other objects of the present invention can be accomplished by a semiconductor memory device comprising: a command latch circuit that latches a command signal supplied via command terminals; an address latch circuit that latches an address signal supplied via address terminals; a mode latch circuit that latches a mode signal supplied via the address terminals; and a command decoder that selects the address latch circuit when a first command is latched by the command latch circuit, and selects the mode latch circuit when a second command is latched by the command latch circuit.

In the present invention, the latch operation of unselected latch circuit does not need to be stopped. Therefore, a signal latched by the unselected latch circuit can be handled as an invalid signal.

The above and other objects of the present invention can also be accomplished by a method of controlling the semiconductor memory device, comprising: a first step for changing a latch timing of the address signal by the address latch circuit by issuing the second command and the mode signal; a second step for performing an operation test by issuing the first command and the address signal; and a third step for determining the latch timing by repeatedly performing the first and second steps by a plurality of times.

As explained above, the semiconductor memory device according to the present invention separately employing an address latch circuit and a mode latch circuit, and selects these circuits based on a command signal. Therefore, the semiconductor memory device can receive a mode signal without entering the mode register set. That is, as the input system of a signal via the address terminal, it becomes possible to dynamically change over between the DDR system and the SDR system. As a result, when a sufficiently large latch margin of the mode latch circuit is secured in advance, there is no risk that the input of the mode signal becomes impossible.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 2 shows an example of a relationship between a command signal and an address signal or a mode signal;

FIG. 6 shows a test result obtained by an operation according to FIG. 5.

DETAILED DESCRIPTION OF THE EMBODIMENTS

Preferred embodiments of the present invention will now be explained in detail with reference to the drawings.

Figure 1:
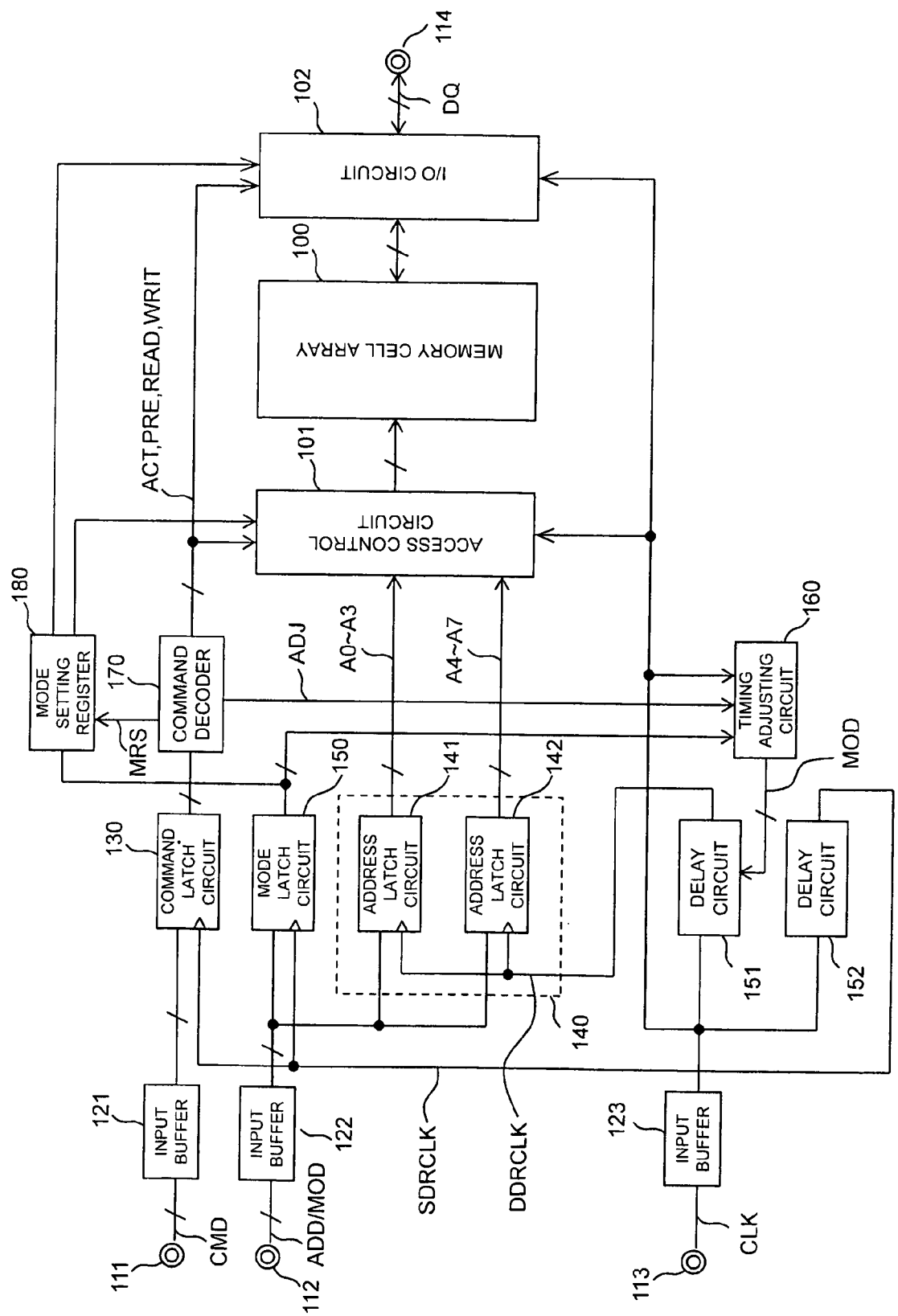
FIG. 1 is a block diagram showing a configuration of relevant parts of a semiconductor memory device according to a preferred embodiment of the present invention.

FIG. 1 is a block diagram showing a configuration of relevant parts of a semiconductor memory device according a preferred embodiment of the present invention.

The semiconductor memory device according to the present embodiment is a DDR synchronous DRAM. As shown in FIG. 1, the semiconductor memory device according to the present embodiment includes a memory cell array 100, an access control circuit 101, and an I/O circuit 102. The access control circuit 101 controls an access to the memory cell array 100. The I/O circuit 102 outputs data read from the memory cell array 100, and inputs data to be written into the memory cell array 100.

The semiconductor memory device according to the present embodiment has a plurality of external terminals including command terminals 111, address terminals 112, a clock terminal 113, and data terminals 114.

The command terminals 111 are supplied with a command signal CMD from the outside. The command signal CMD is accepted by an input buffer 121. The command signal CMD accepted by the input buffer 121 is supplied to a command latch circuit 130. The command latch circuit 130 latches the command signal CMD in response to a rising edge of an internal clock SDRCLK.

The command signal CMD latched by the command latch circuit 130 is supplied to a command decoder 170, thereby activating various kinds of internal signals according to the content of the command signal CMD. This internal signal includes an activation signal ACT, a precharge signal PRE, a read signal READ, a write signal WRIT, and a mode register set signal MRS. These internal signals are supplied to the access control circuit 101, the I/O circuit 102, and a mode setting register 180, thereby making these circuits operate predetermined operations.

The mode setting register 180 is used so as to set various operation modes of the semiconductor memory device such as a CAS latency, a burst length and so on during the normal operation. Contents to be set to the mode setting register 180 are supplied from the address terminals 112. When the command signal CMD become in a predetermined value, the command decoder 170 activates an adjustment signal ADJ. The adjustment signal ADJ is supplied to a timing adjusting circuit 160 described later.

The address terminals 112 are supplied with the address signal ADD or a mode signal MOD from the outside. The address signal ADD or the mode signal MOD is accepted by an input buffer 122. The address signal ADD and the mode signal MOD accepted by the input buffer 122 are supplied in common to an address latch circuit 140 and a mode latch circuit 150.

As described later, only the address signal ADD is handled as a valid signal out of the signals latched by the address latch circuit 140. Even when the address latch circuit 140 latches the mode signal MOD, this latched signal is not used. Similarly, only the mode signal MOD is handed as a valid signal out of the signal latched by the mode latch circuit 150. Even when the mode latch circuit 150 latches the address signal ADD, this latched signal is not used.

The address latch circuit 140 includes two address latch circuits 141 and 142. The address latch circuit 141 latches the address signal ADD in response to the rising edge of an internal clock DDRCLK. On the other hand, the address latch circuit 142 latches the address signal ADD in response to the falling edge of the internal clock DDRCLK. The address signal ADD latched by the address latch circuit 140 is supplied to the access control circuit 101, and is recognized as a row address or a column address in response to the corresponding command.

On the other hand, the mode latch circuit 150 latches the mode signal MOD in response to the rising edge of an internal clock SDRCLK. The mode signal latched by the mode latch circuit 150 is supplied to the mode setting register 180 and the timing adjusting circuit 160 described later.

The clock terminal 113 is supplied with a clock signal CLK from the outside. The clock signal CLK is accepted by the input buffer 123. The received clock signal CLK accepted by the input buffer 123 is supplied to delay circuits 151 and 152, a timing adjusting circuit 160, an access control circuit 101, and an I/O circuit 102. The semiconductor memory device according to the present embodiment is a DDR synchronous DRAM. Therefore, the I/O circuit 102 inputs and outputs data DQ synchronously with both the rising edge and the falling edge of the clock signal CLK.

The delay circuit 151 generates the internal clock DDRCLK based on the clock signal CLK. The generated internal clock DDRCLK is supplied to the two address latch circuits 141 and 142 constituting the address latch circuit 140. The phase of the internal clock DDRCLK is fine adjusted by the mode signal MOD supplied from the timing adjusting circuit 160. The reason why this fine adjustment is necessary is that because the address latch circuit 140 uses both the rising edge and the falling edge of the internal clock DDRCLK as active edges, the latch margin is small.

On the other hand, the delay circuit 152 generates the internal clock SDRCLK based on the clock signal CLK. The generated internal clock SDRCLK is supplied to the command latch circuit 130 and the mode latch circuit 150. In the present embodiment, a circuit that fine adjusts the phase of the internal clock SDRCLK is not provided. In the command latch circuit 130 and the mode latch circuit 150, because only the rising edge of the internal clock SDRCLK is used as an active edge, latch margin is sufficiently large. However, a circuit that fine adjusts the phase of the internal clock SDRCLK can be provided.

Phases of the internal clocks DDRCLK and SDRCLK are adjusted with respect to the clock signals supplied from the outside. Therefore, both the internal clocks DDRCLK and SDRCLK have the same frequencies as that of the clock signal CLK.

FIG. 2 shows an example of a relationship between the command signal CMD and the address signal ADD or the mode signal MOD.

In the example shown in FIG. 2, a signal supplied from the command terminals 111 is a three-bit signal. Therefore, the command signal CMD is constituted of three bits of C0 to C2. On the other hand, a signal supplied from the address terminals 112 is a four-bit signal. Because the address signal ADD is continuously supplied synchronously with both edges of the internal clock DDRCLK, the address signal ADD is constituted of eight bits of A0 to A7. On the other hand, because the mode signal MOD is supplied synchronously with the rising edge of the internal clock SDRCLK, the mode signal MOS is constituted of four bits of M0 to M3. The number of bits of each signal is not limited to the above, and the above number is for explanation only.

As shown in FIG. 2, in the present example, the internal clock considered to be valid in the address latch circuit 140 or the mode latch circuit 150 is changed over dynamically by a logic value of C0. Specifically, when the logic value of C0 is 0 (=low level), the internal clock DDRCLK is selected, and the signal (address signal ADD) supplied via the address terminals 112 is latched by the address latch circuit 140. On the other hand, when the logic value of C0 is 1 (=high level), the internal clock SDRCLK is selected, and the signal (mode signal MOD) supplied via the address terminals 112 is latched by the mode latch circuit 150. The above changeover between the internal clocks is not performed by executing the mode register set to the mode setting register 180, but is performed dynamically based on the logic value of C0.

However, except in the standby state, the internal clocks DDRCLK and SDRCLK are always generated. That is, an unselected internal clock does not stop, but only the address signal ADD or the mode signal MOD latched by the unselected internal clock is considered to be invalid. The unselected internal clock is also effectively used in other circuit block. That is, the selection of the internal clock based on C0 is the selection in the address latch circuit 140 and the mode latch circuit 150, and does not affect other circuit.

As explained above, when the internal clock DDRCLK is selected (C0=0), the address signal ADD latched by the address latch circuit 140 is considered to be valid. In this case, while the mode latch circuit 150 can also latch the address signal ADD, the signal latched by the mode latch circuit 150 is invalid, and is not used. On the other hand, when the internal clock SDRCLK is not selected (C0=1), the mode signal MOD latched by the mode latch circuit 150 is considered to be valid. In this case, while the address latch circuit 140 can also latch the mode signal MOD, the signal latched by the address latch circuit 140 is invalid, and is not used.

When the internal clock DDRCLK is selected (C0=0) A0 to A3 of the address signal ADD are latched by the address latch circuit 141 in response to the rising edge of the internal clock DDRCLK. Next, A4 to A7 of the address signal ADD are latched by the address latch circuit 142 in response to the falling edge of the internal clock DDRCLK. As described above, in the present embodiment, the address signal ADD is latched at two divided times by the DDR system. Therefore, the number (=four terminals) of the address terminals 112 can be made smaller than the number of bits (=eight bits) of the address signal ADD.

In the example shown in FIG. 2, when the value of C0 to C2 is "011", the command decoder 170 activates the activation signal ACT. Therefore, the address signal ADD latched when the command is issued is handled as a row address within the access control circuit 101.

When the value of C0 to C2 is "000", the command decoder 170 activates the read signal READ. Therefore, the address signal ADD latched when the command is issued is handled as a column address within the access control circuit 101 and the I/O circuit 102 performs the read operation (output of the data DQ).

When the value of C0 to C2 is "010", the command decoder 170 activates the write signal WRIT. Therefore, the address signal ADD latched when the command is issued is handled as a column address within the access control circuit 101 and the I/O circuit 102 performs the write operation (input of the data DQ).

When the value of C0 to C2 is "001", the command decoder 170 activates the precharge signal PRE. Therefore, the address signal ADD latched when the command is issued is handled as a bank address within the access control circuit 101, and the assigned bank is precharged.

On the other hand, when the value of C0 to C2 is "1XX" (X is "don't care"), the command decoder 170 activates the adjustment signal ADJ. The mode signal MOD latched by the mode latch circuit 150 when the command (adjustment command) is issued is handled as a valid signal within the timing adjustment circuit 160.

The timing adjustment circuit 160 adjusts a delay amount of the delay circuit 151 based on the content of the mode signal MOD supplied when the adjustment signal ADJ is active. As described above, in the present example, the mode signal MOD is a four-bit signal. Therefore, the delay amount can be also adjusted to 16 steps ($=2^4$).

The operation of the semiconductor memory device according to the present embodiment will be explained next.

Figure 3:
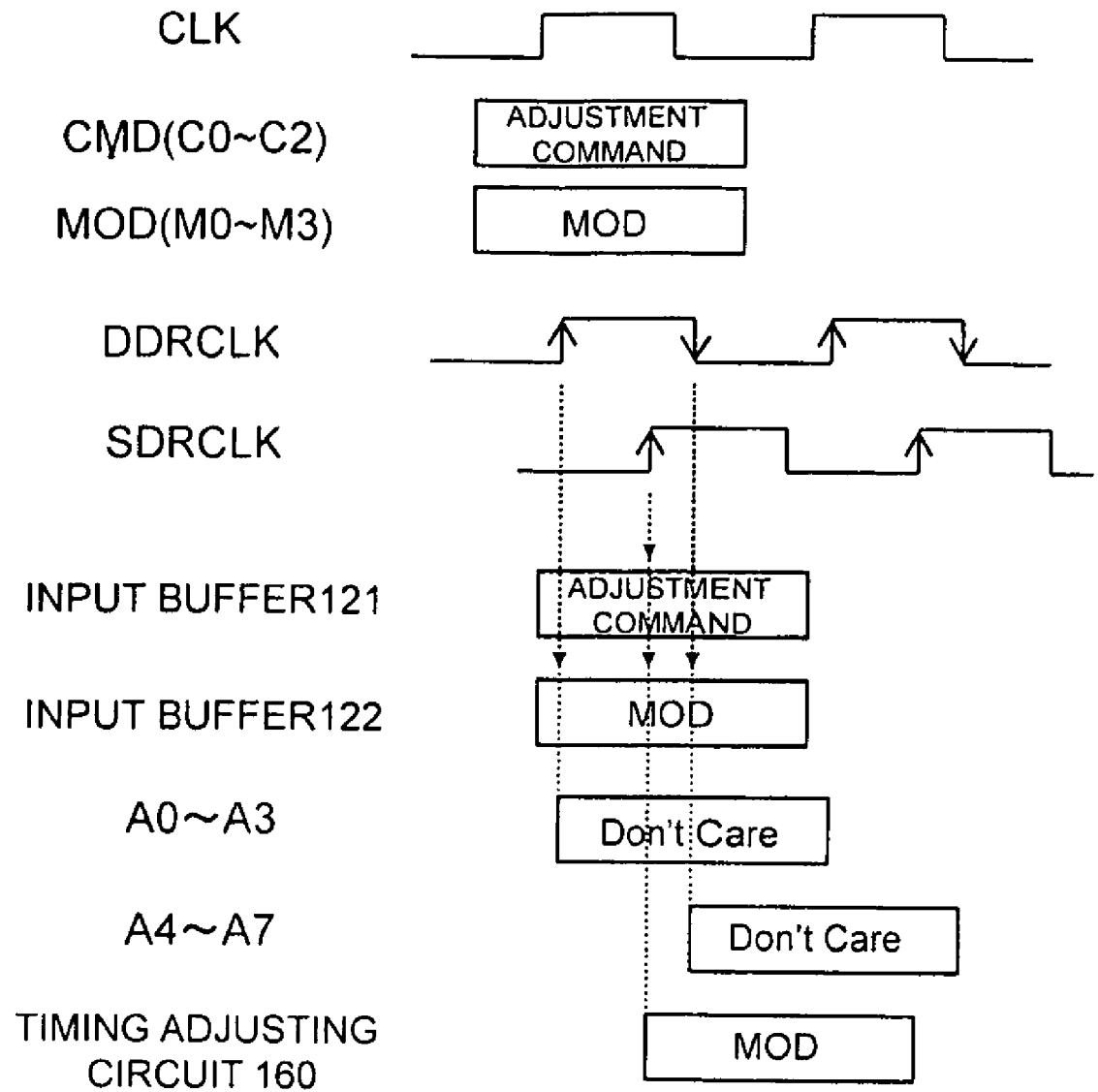
FIG. 3 is a timing chart for explaining the operation when an adjustment command is issued.

FIG. 3 is a timing chart for explaining the operation when an adjustment command is issued. When the command signals C0 to C2 are "1XX", the "adjustment command" is issued.

As described above, the command signal CMD is latched by the command latch circuit 130 synchronously with the rising edge of the internal clock SDRCLK. In this case, the mode signal MOD supplied via the address terminals 112 is latched by the mode latch circuit 150 synchronously with the rising edge of the internal clock SDRCLK. Because these signals are latched synchronously with the rising edge of the internal clock SDRCLK, latch margin is sufficiently large.

When the command latch circuit 130 latches the adjustment command, the adjustment signal ADJ is activated. On the other hand, the internal commands for operating the access control circuit 101 and the I/O circuit 102 such as the activation command ACT are not activated. Therefore, the operation contributing to the read/write is not performed.

When the adjustment signal ADJ is activated, the timing adjustment circuit 160 recognizes the mode signal MOD latched by the mode latch circuit 150 as a valid signal. Thereby the timing adjustment circuit 160 changes the delay amount of the delay circuit 151 according to the logic value of the mode signal MOD.

In the case where the internal clock DDRCLK has the phase as shown in FIG. 3, a continuous latching of the address signal ADD using both edges of the internal clock DDRCLK is difficult due to the shortage of setup time. However, when the adjustment command is issued, the mode signal MOD can be latched with sufficient margin, because the latch is performed using the rising edge of the internal clock SDRCLK.

Figure 4:
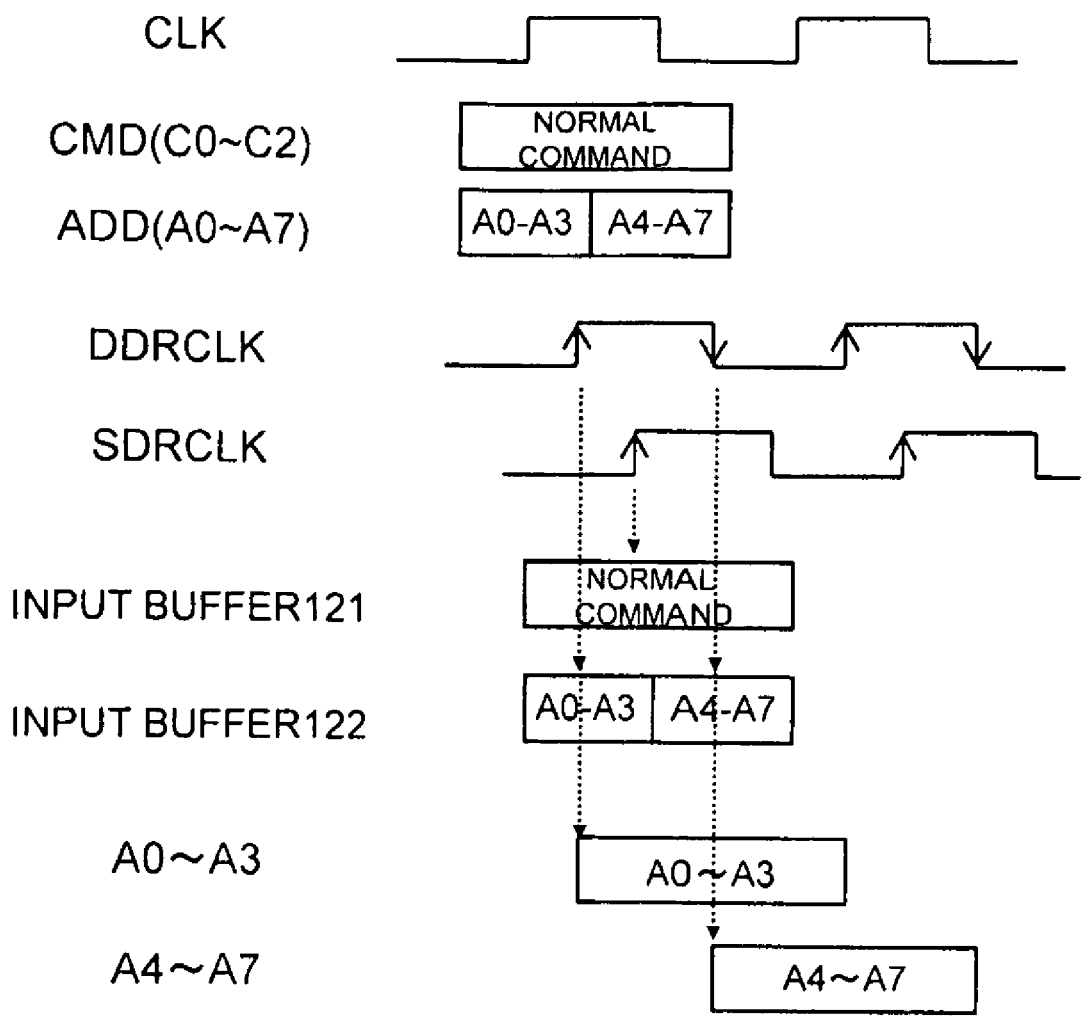
FIG. 4 is a timing diagram for explaining the operation when the normal command other than the adjustment command is issued.

FIG. 4 is a timing diagram for explaining the operation when the normal command other than the adjustment command is issued. The normal command means a command that enables internal signals such as the activation signal ACT, the precharge signal PRE, the read signal READ, and the write signal WRIT to be activated. That is, the normal command includes all commands excluding the adjustment command.

As shown in FIG. 4, when the normal command other than the adjustment command is issued, the address signal ADD is supplied in response to this. The first half (A0 to A3) of the supplied address signal ADD is latched by the address latch circuit 141 synchronously with the rising edge of the internal clock DDRCLK, and the latter half (A4 to A7) of the address signal ADD is latched by the address latch circuit 142 synchronously with the falling edge of the internal clock DDRCLK. That is, the address signal ADD is latched by the DDR system.

Therefore, the latch margin of the address signal ADD is small, and the phase of the internal clock DDRCLK needs to be accurately adjusted to perform a correct latch operation. This fine adjustment is performed by the adjustment command explained with reference to FIG. 3.

When the command latch circuit 130 latches the normal command, corresponding internal signal such as the activation signal ACT, the precharge signal PRE, the read signal READ, or the write signal WRIT is activated. Accordingly, the access control circuit 101 and the I/O circuit 102 perform predetermined operations such as the read operation and the write operation.

Figure 5:
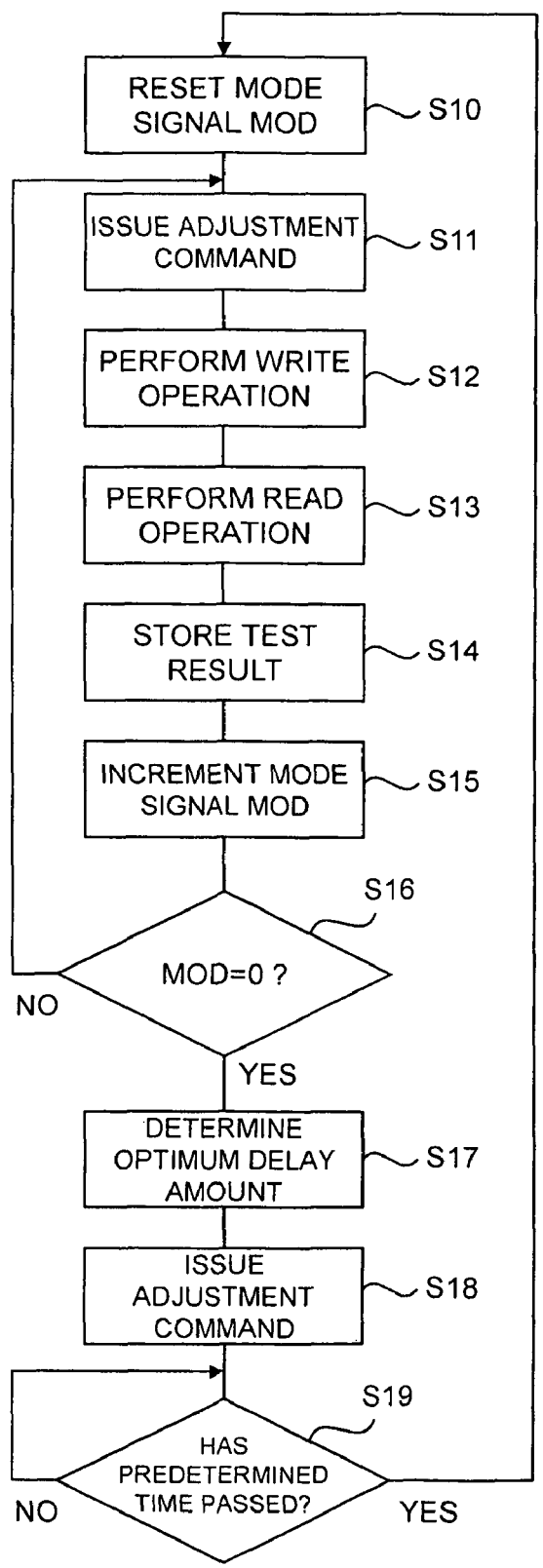
FIG. 5 is a flowchart for explaining the operation of a memory controller that controls the semiconductor memory device according to the embodiment of the present invention.

FIG. 5 is a flowchart for explaining the operation of a memory controller that controls the semiconductor memory device according to the present embodiment.

First, the mode signal MOD is set to zero (=0000) (step S10), and the adjustment command and the mode signal MOD are issued (step S11). Accordingly, the adjustment signal ADJ is activated, and a delay amount of the delay circuit 151 is set to the delay amount corresponding to the mode signal MOD=0000. As described above, when the adjustment command is issued, the mode signal MOD is latched by the SDR system. Therefore, the latch margin is sufficient. Consequently, there is little risk that the mode signal MOD cannot be latched.

In this state, the write operation of test data (step S12), and the read operation of the written test data (step S13) are performed, and a test result is temporarily stored (step S14). As described above, in the case where the read command or the write command are issued, the address signal ADD is latched by the DDR system. Therefore, the latch margin is small, and there is a risk that the address signal ADD cannot be correctly accepted depending on the phase of the internal clock DDRCLK. When the address signal ADD cannot be correctly latched, the write operation and the read operation cannot be correctly performed.

The test result can be considered to be pass when the written test data completely coincides with the test data. On the other hand, the test result can be considered to be fail when even one bit data does not coincide with each other. Alternatively, only a part of the burst data can be compared, by considering the influence due to a deviation between the input and output timings of the data DQ. For example, when the test data is "00001111", a determination can be made based on a comparison between "x00xx11x" (x is "don't care") and the read data.

Next, it is determined whether the mode signal MOD is zero (=0000), by incrementing the value of the mode signal MOD (step S16). When the mode signal MOD is not zero (step S16: NO) as a result, a series of the test operation is not completed. Therefore, the process returns to step S12, and the mode signal MOD and the adjustment command are issued (step S12). In this case, because the mode signal MOD is incremented to (=0001), the delay amount of the delay circuit 151 is set to the delay amount corresponding to the mode signal MOD=0001.

As described above, the test data is read and written while changing the delay amount of the delay circuit 151 by each one step. When the read and write of the test data are performed for all delay amounts (16 steps in the present example), the mode signal MOD returns to zero (=0000) by incrementing the mode signal MOD (step S15) (step S16: YES)

In response to the above, an optimum delay amount is determined by referencing the test result temporarily stored at step S14 (step S17). When the test result is as shown in FIG. 6, it is preferable that the center value having a largest margin is employed as the optimum delay amount.

The mode signal MOD indicating the optimum delay amount is issued together with the adjustment command (step S18). Accordingly, the delay amount of the delay circuit 151 is set to a value having a largest margin, and the series of adjustment operation is finished.

Thereafter, it is determined whether a predetermined time has passed, using a timer (step S19). When a predetermined time has passed (step S19: YES), the process returns to step S11, and a series of adjustment operation is performed again. Because the fine adjustment of the delay amount is performed periodically, a reduction of the latch margin due to changes of the ambient temperature and/or the power supply voltage can be prevented.

As explained above, in the present embodiment, the address signal ADD is input by the DDR system. Therefore, the number of the address terminals 112 can be made smaller than the number of bits constituting the address signal ADD. Further the address latch circuit 140 and the mode latch circuit 150 are provided separately, and these are selected based on the command signal CMD. Accordingly, the mode signal MOD can be accepted dynamically without entering the mode register set. As a result, when a sufficiently large margin of the mode latch circuit 150 is secured in advance, there is no risk that the input of the mode signal is impossible.

The present invention is in no way limited to the aforementioned embodiments, but rather various modifications are possible within the scope of the invention as recited in the claims, and naturally these modifications are included within the scope of the invention.

For example, while in the above embodiment, the internal clock (DDRCLK) supplied to the address latch circuit 140 is a separate signal from the internal clock (SDRCLK) supplied to the mode latch circuit 150, it is not essential that these signals are separate signals in the present invention. Therefore, the mode latch circuit 150 can also use the internal clock DDRCLK, and the rising edge (or the falling edge) can be considered to be an active edge.

In the above embodiment, while the frequency of the internal clock DDRCLK is the same as the frequency of the internal clock SDRCLK, these frequencies can be different. For example, the former frequency can be two times the latter frequency, and both the address latch circuit 140 and the mode latch circuit 150 can use the rising edges (or the falling edges) of the corresponding clocks as active edges.

In the above embodiment, while the mode signal MOD latched by the mode latch circuit 150 is used to adjust the delay amount of the internal clock DDRCLK, the present invention is not limited to this.

While the reading and writing of the test data are performed for all delay amounts (16 steps of delay amount) in the flowchart shown in FIG. 5, when the optimum delay amount can be determined, the test does not need to be performed for all delay amounts. Therefore, the test can be ended at the point of time when a Fail-Pass-Fail pattern appears as a result of performing the test while sliding the delay amount to one direction.

The application target of the present invention is not limited to DRAMs, and the present invention can be widely applied to synchronous memories other than DRAMs.

What is claimed is:
1. A semiconductor device, comprising:
terminals supplied selectively with an address signal or a mode signal;
an address latch circuit coupled, when selected, to the terminals to latch the address signal; and
a mode latch circuit coupled, when selected, to the terminals to latch the mode signal,
wherein the terminals are supplied with the address signal when the semiconductor device is in a first mode, the terminals being supplied with the mode signal when the semiconductor device is in a second mode, the address latch circuit latching the address signal in the first mode, and the mode latch circuit latching the mode signal in the second mode, and
wherein the address signal is latched in synchronization with an internal clock signal in the first mode, the internal clock signal being generated by causing a first delay in an external clock signal, and an amount of the first delay being controlled by the mode signal.

2. The semiconductor device as claimed in claim 1, further comprising command terminals, wherein the first mode is functioned when the command terminals are supplied with a first command signal and the second mode is functioned when the command terminals are supplied with a second command signal.

3. The semiconductor device as claimed in claim 1, wherein the mode latch circuit latches the mode signal in synchronization with an additional internal clock signal and the additional internal clock is generated by causing a second delay in the external clock signal and an amount of the second delay is fixed.

4. The semiconductor device as claimed in claim 1, wherein the address signal comprises a first address signal and a second address signal supplied after the first address signal, and the address latch circuit including a first address latch circuit which latches the first address signal in synchronization with a rising edge of the internal clock signal and a second address latch circuit which latches the second address signal in synchronization with a trailing edge of the internal clock signal.

5. The semiconductor device as claimed in claim 3, wherein the additional internal clock is substantially the same in frequency as the internal clock and different in phase from the internal clock.

* * * * *